United States Patent
Ruelle et al.

(10) Patent No.: US 7,319,189 B2
(45) Date of Patent: Jan. 15, 2008

(54) SOLAR CONCENTRATOR

(75) Inventors: Vincent Ruelle, Jodoigne (BE); Serge Habraken, Comblain-au-pont (BE); Jean-Paul Collette, Embourg (BE)

(73) Assignee: Universite de Liege, Liege (BE)

( * ) Notice: Subject to any disclaimer, the term of this patent is extended or adjusted under 35 U.S.C. 154(b) by 440 days.

(21) Appl. No.: 10/973,410

(22) Filed: Oct. 27, 2004

(65) Prior Publication Data

US 2006/0086383 A1 Apr. 27, 2006

(51) Int. Cl.
*H01L 31/052* (2006.01)

(52) U.S. Cl. .................. 136/246; 136/292
(58) Field of Classification Search ............... 136/246, 136/292
See application file for complete search history.

(56) References Cited

U.S. PATENT DOCUMENTS

| 4,316,448 A * | 2/1982 | Dodge ..................... 126/600 |
| 5,520,747 A | 5/1996 | Marks ..................... 136/245 |
| 5,885,367 A | 3/1999 | Borwn et al. |
| 6,017,002 A | 1/2000 | Burke et al. ............ 244/173 |
| 6,050,526 A | 4/2000 | Stribling, Jr. ............ 244/173 |
| 6,118,067 A | 9/2000 | Lashley et al. |
| 6,177,627 B1 * | 1/2001 | Murphy et al. .......... 136/246 |
| 6,188,012 B1 * | 2/2001 | Ralph ..................... 136/246 |
| 6,528,716 B2 * | 3/2003 | Collette et al. ......... 136/246 |

FOREIGN PATENT DOCUMENTS

WO    WO00/79593    12/2000

* cited by examiner

*Primary Examiner*—Nam Nguyen
*Assistant Examiner*—Anthony Fick
(74) *Attorney, Agent, or Firm*—Jacobson Holman PLLC

(57) ABSTRACT

A space solar concentrator based on deployable reflectors attached to a panel base is described. Each of the reflectors includes sides coated with reflective coating on surfaces facing away from the base. In one embodiment, the sides of the reflector have thicker portion to provide stiffness for deployment absent compressive force, and thinner portion to reduce weight and storage energy. In another embodiment, both reflective sides are unfolded when the reflectors are in stowed position. During deployment, a stop side will limit the deployment of both reflective sides and ensure the proper reflecting position. In addition, these embodiments reduce the storage energy.

19 Claims, 7 Drawing Sheets

SOLAR CONCENTRATOR

BACKGROUND OF THE INVENTION

1. Field of the Invention

The present invention relates to a solar concentrator, particularly a space solar concentrator, to form a solar panel with rows of collapsible reflectors alternating with rows of solar cells.

2. Description of Prior Art

Spacecraft typically carries solar cells as a primary energy source. The solar cells are positioned and oriented on the spacecraft so that they are exposed to solar radiation.

On body-stabilized spacecraft, solar cells are typically arranged in planar arrays and carried on solar wings, which extend from opposite sides of a spacecraft body. Preferably, the solar wings rotate to keep them as orthogonal to the solar radiation as possible. Because the solar wings can be quite long in their deployed configuration, they are generally formed of a plurality of planar solar panels which are coupled together in an accordion arrangement (one-dimensional deployment) or in a paving arrangement (two-dimensional deployment) so that they can be collapsed to a smaller stowed configuration for spacecraft launch.

The number of solar cells that must be carried by a spacecraft is a function of the anticipated spacecraft power demand and the efficiency of the solar cells. Although high-efficiency solar cells reduce the number of cells required by a specific spacecraft, they are quite expensive. Because weight and weight-related costs also increase with the number of solar cells, there is a considerable incentive to reduce the quantity of solar cells that a spacecraft must carry.

Accordingly, efforts have been extended to concentrate solar radiation upon solar cells by using reflective surfaces that are positioned adjacent to solar panels and oriented to reflect additional radiation onto the cells. Solar radiation that would otherwise have passed by a solar wing is thus redirected to be incident upon the solar cells. Although a solar cell's efficiency in conversion of this additional reflected radiation to useful energy is typically less than it is for the directly incident radiation, primarily due to increased cell temperature and slanted angle of incidence, solar concentration allows the number of spacecraft solar cells to be significantly reduced with consequent savings in spacecraft weight and cost. Both rigid and flexible reflectors have been proposed for solar radiation concentration with flexible reflectors generally having a weight advantage. An exemplary flexible reflector system is shown in U.S. Pat. Nos. 6,017,002 and 6,050,526. An exemplary rigid reflector system is shown in U.S. Pat. No. 5,520,747.

Although these reflector systems concentrate solar radiation, their positioning adjacent to solar panel give rise to several drawbacks. The solar cell temperature increases and consequently the power conversion efficiency decreases. The pointing errors induce lack of flux uniformity on the cell panel and the power management is complicated, consequently decreasing the panel electric power collection.

In the case of deployable reflectors, the position of the reflectors and their deployment is not easily compatible with a two-dimensional deployment of the solar panels (paving-type panels) but only with a one-dimensional deployment thereof (accordion panels).

Another type of concentration with reflectors consists in distributing small reflectors on the solar panel. Reflectors are lying in solar cell rows, alternatively. It reduces or cancels several of the mentioned drawbacks. The present invention is related to this kind of configuration. U.S. Pat. Nos. 6,188,012, 6,177,627, 6,528,716 and WO 00/79593 A1 are also describing some embodiments based on this geometric concept.

U.S. Pat. No. 6,188,012 applies only to a deployable concentrator. The deployment of the reflector is ensured thanks to several kinds of springs. After deployment, the spring is used to keep the reflective film under tension. The main drawback of such a device is the mechanical fatigue that occurs after a long time in space (with thermal cycling during each eclipse). For telecommunication spacecraft, the solar array must stay fully operational for 15 years in geostationary orbit. One eclipse per day occurs. A few thousand thermal cycles will result from a few thousand daily eclipses. If the reflector tension is progressively altered due to spring relaxation, the optical quality and the illumination uniformity will degrade. The effective concentration factor will vanish, with a significant loss for the spacecraft power generation. For that reason, after deployment, the reflective films need a fixer to ensure that no more mobility can produce the loss of tension. This patent is furthermore presenting deployment/storage concepts that are not fully valid. When the reflectors are stowed, their length looks smaller than when they are in deployed configuration. A realistic drawing would certainly depict that, in the stowed configuration, the reflector film is partially shading the solar cells. In case of reflector deployment failure, the reflective films are shadowing the solar cells and the resulting power generation is vanishing. This is another drawback that one aspect of the present invention intends to avoid.

U.S. Pat. No. 6,177,627 provides a compressible reflector apparatus comprising a flexible sheet and an erector under the sheet and mounted to a base. The sheet functions as a reflector for reflect lights. The erector supports the sheet. Thus two distinct parts are required.

WO 00/79593 A1 is presenting a concept with self-deployable reflectors. They are clearly shadowing the cells in the stowed configuration. There is no blocking mechanism after deployment. During storage, the solar panels are conventionally mounted in stack with small space in between. The stowed reflectors are using this available space but, since no locking mechanisms are present in the stowed configuration, the reflectors of panel i are collapsed against reflectors from the next panel (i+1).

This configuration is doubtful since vibration (during transportation and launch, for instance) could generate scratches on the reflective films, altering the optical quality and later the effective solar concentration with a loss of power generation.

U.S. Pat. No. 6,528,716 provides deployable solar concentrator having foldable reflectors. Similar to U.S. Pat. Nos. 6,188,012 and 6,177,627, the reflector needs both the erecting element and reflecting element for its proper operation. The compressible reflector also includes at least one reflector surface that must be folded when the concentrator is in stowed position.

In addition, all above references teach concentrators requiring a comparatively large amount of deployment energy.

SUMMARY OF THE INVENTION

According to one aspect of the present invention, the sawtooth (or wedge like) reflectors are self-deployable, and in the stowed position, the reflectors do not overlap the cell rows. In addition, the reflector includes one element that is both deployable and reflective. Therefore, an additional erector is not needed.

After deployment, reflectors collect and concentrate the solar flux to the cells. Before deployment of the reflectors, one of the preferred embodiment uses reflectors folded on the panel substrate to keep the folded geometry. According to another aspect of the invention, the deployable reflector includes two reflective surfaces that do not need to be folded when in stowed position, thus improve the figuration and operation efficiency of the solar cell concentrators.

An object of the present invention is to provide a solar concentrator comprising rows of solar cells alternating with rows of collapsible reflectors to reflect incident energy onto directly adjacent solar cells and a base on which the reflectors and rows of solar cells are mounted, wherein each row of the reflectors comprises a sheet having a pair of opposite surfaces with reflective coating on one surface facing away from the base. The sheet comprises a pair of parallel edges being fixed to said base and spaced apart, and a first and a second sides, each being in connection with one of said pair of edges. Absent external forces, said first side will pivot away from said base and, with the second sides, will form a cross-sectional triangular shape. Upon exertion of compressive force, said first side will pivot toward said base, the second side is capable of being folded towards the base and said sheet will collapse. Preferably, the first side includes an integrated frame part of a first thickness in combination with thinner parts of a second thickness. The second side includes areas of a third thickness, said second and third thickness being thinner than the first thickness.

Another object of the present invention is to provide a solar concentrator comprising rows of solar cells alternating with rows of collapsible reflectors to reflect incident energy onto directly adjacent solar cells and a base on which the reflectors and rows of solar cells are mounted, wherein each row of the reflectors comprises a first and a second elongated sections being parallel to the rows of solar cells and fixed to said base and spaced apart, a first side being in connection with one side of the first section that is proximal to the row of solar cells and coated with reflective coating on one surface facing away from the base, a second side connecting the first side and one side of the second section that is proximal to the first section, and a third side being in connection with the other side of the second section that is distal to the first section and coated with reflective coating on one surface facing away from the base. Absent external forces, said first side will pivot away from said base and, with the second sides, will form a cross-sectional triangular shape and support the third side being pivot away from said base such that a top edge of the third side is in contact with a dihedral edge between the first side and the second side. Upon exertion of compressive force, said first side and third side will pivot toward said base with their surfaces unfolded. The second side is capable of being folded towards the base so that said reflector will collapse. The second planar side may include a plurality of stripes separated by openings. Each of the reflectors may be made from one piece of material or assembled from separate parts. Such configuration may also reduce the stored energy needed for deployment.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a conceptual view of a solar concentrator of the present invention, wherein "SF" refers to solar flux. The reflectors looks like saw teeth in rows with solar cell rows in between.

FIGS. 5A, 5B, 5C and 5D illustrate the first embodiment of the present invention in different configurations, in which

FIGS. 6A, 6B, 6C, 6D and 6E illustrate the second embodiment of the present invention in different configurations, in which

DETAILED DESCRIPTION OF THE PREFERRED EMBODIMENTS

Figure 1:
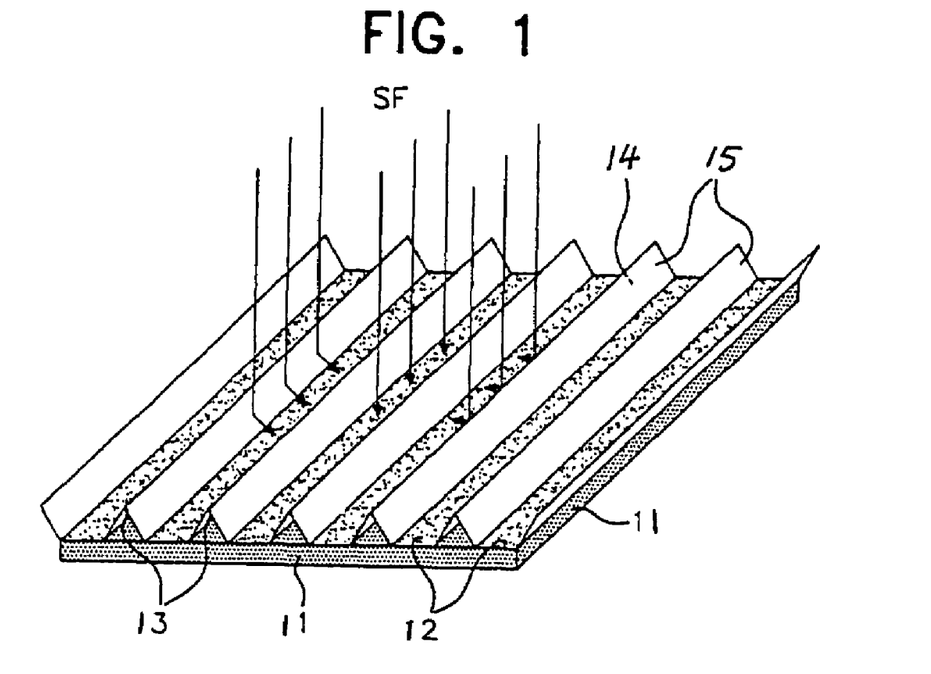

Referring to FIG. 1, there is illustrated a solar concentrator following the present invention. Rows of saw tooth reflectors 13 and solar cells 12 are alternatively presented. They are mounted on the solar panel structure 11, such as a honeycomb panel structure by adapted fasteners. This structure is usually made of an aluminum honeycomb with CFRP (Carbon Fiber Reinforced Polymer) face sheets on both sides. The solar radiation is incident on the panel structure 11. It will reach the solar cells 12 either directly or after reflection on the reflective coating of the reflectors 13. In one preferred embodiment, the row widths are similar for the solar cells 12 and the reflectors 13, depending on the geometric concentration factor. For example, the widths are identical when the geometric concentration factor is 2:1. The reflector inclination angle depending on the geometric concentration factor is about 60 degrees and it is exactly 60 degrees when the geometric concentration factor is 2:1. With a geometric concentration factor of 2:1, it means that two square meters of solar radiation are concentrated on one square meter of solar cells. Since high-efficiency solar cells are very expensive, concentration is very attractive to reduce the solar panel cost.

Figure 2:
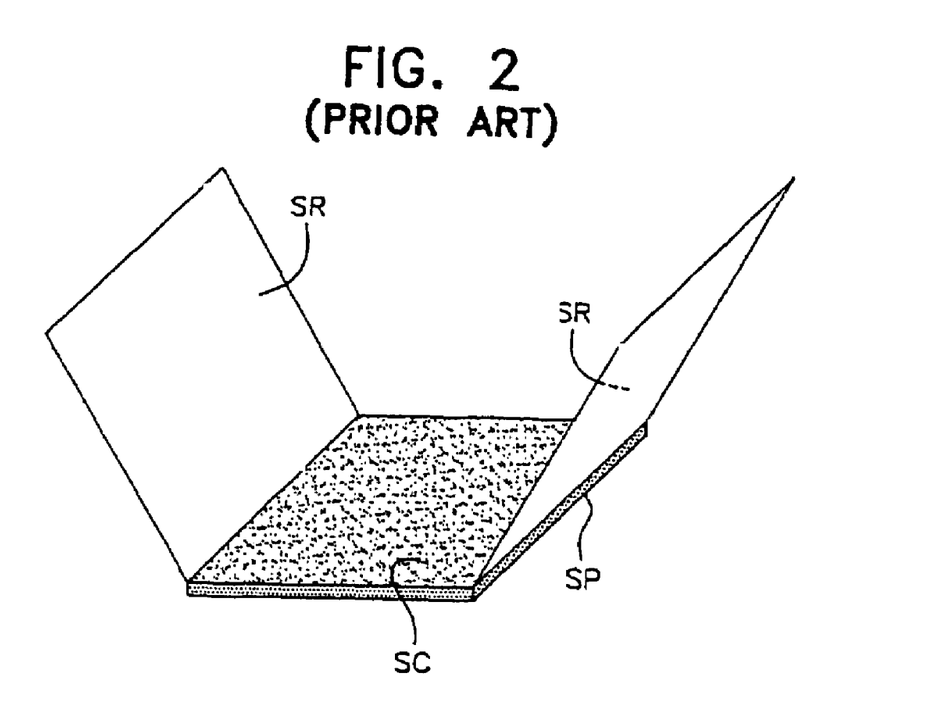
FIG. 2 is a perspective view of the prior art device—the trough concentrator with reflectors adjacent to the solar panel, in which "SR" refers to solar radiation, "SC" refers to solar cell and "SP" refers to solar panel.

FIG. 2 depicts a trough reflector which reaches the same concentration factor but with reflectors adjacent to the solar panel. This configuration is thermally disadvantageous as the cooling area is drastically reduced compared to the collection area. This configuration is similar to the concept described in U.S. Pat. No. 5,520,747, No. 6,017,002, and No. 6,050,526.

Referring to FIG. 1, the solar reflectors 13 are made of thin and flexible foils with reflective coating deposited onto. The foils can be made in high strength alloys like Titanium, Stainless Steel, Beryllium Copper, or any mechanically resistant alloy. The material selection depends on the mechanical properties and the mass parameters. By using lightweight materials like Titanium, the reflectors are promising for mass reduction. A triple junction solar cell with its coverglass weights about 1.1 kg per square meter and a Titanium reflector may weight only 0.35 kg per square meter. The foil thickness depends on the required reflector stiffness and on the maximum stored energy inside the stowed reflectors (important for the deployment and for the vibration in stowed configuration). In one of the preferred embodiment, the material is high strength Titanium alloy with thickness of 1-2 mils (+/−25-50 microns).

The use of solar reflectors 13 integrated in the solar panel area allows a more versatile and modular design of the deployed solar panel, compared to the prior art where the reflectors are adjacent to the solar panels. Indeed, in the later case, the solar panel deployment will more easily happens in a one-dimensional sequence, accordion-type. The present invention is still compatible with more complex deployment schemes like two-dimensional paving. The modularity is significantly improved and the power generation can be easily adapted to various levels.

In the present invention, the ratio given by collection surface/cooling surface is not significantly increased compared to the prior art with reflectors adjacent to the solar panel. Actually, in the present invention, the collection surface is almost the same and the cooling surface is 75 percent of the classical planar panels. Only about half of the front surface (the solar cell rows) is efficiently used for cooling. In the prior art, the collection area is doubled with an unchanged cooling area compared to the classical planar panels. It is the same to tell that the cooling area with respect to the collection area is only 50 percents compared to the planar arrays. Since the cooling area remains closer to the classical arrays compared to the prior art, a smaller temperature increase is expected for the present invention (only about 20° C.) compared to the prior art (about 40° C.). It is a serious advantage as it reduces the outgassing of the glues used for the bonding of the solar cells and coverglasses. Furthermore, the reflector temperature can be significantly increased compared to the prior art with adjacent reflectors. Actually, in the prior configuration, the reflector rear surface is facing the cold space, which is not the case for the present invention where the reflectors 13 are facing the panel substrate 11. Therefore, significantly warmer reflectors are achievable. This is an additional serious advantage for contamination issues, which are at the origin of power generation degradation on the prior panel with adjacent reflectors. In addition, the solar cell temperature could be drastically decreased by improving the temperature profile on the front facesheet. The use of high conductivity CFRP would help to distribute the concentrated solar heat on the front sheet. Usual CFRP thermal conductivity along the fibers ranges around 35 W/m/K. High conductivity CFRP can reach 500 W/m/K thanks to high conductivity carbon fibers. In addition, this kind of CFRP shows higher stiffness in the range of 490-560 Gpa compared to 93 Gpa for conventional CFRP. A ply of conductive CFRP could simply be added to a conventional CFRP ply in order to increase the conductivity perpendicularly to the solar cell rows 12. Another way can be to add thermally conductive filaments into or onto the usual CFRP, in a direction perpendicular to the solar cell rows or use carbon nanotube based material such as the nanotube backy paper. By making this, we have a kind of thermal bridges between warmer area under the cells 12 and colder area under the reflectors 13.

Figure 3A:
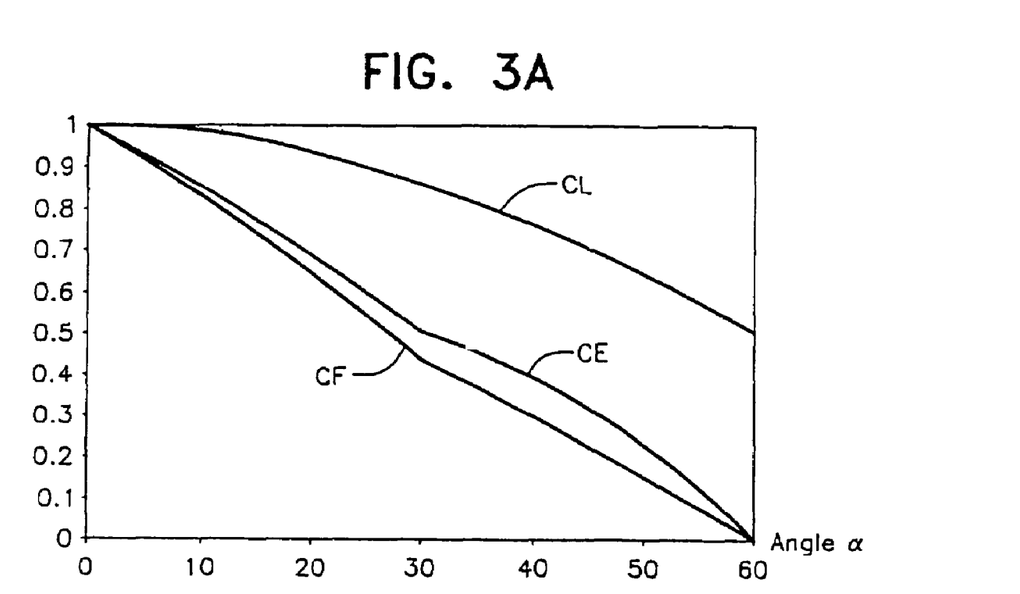
FIGS. 3A and 3B are charts illustrating the collection loss due to tracking error in concentration type described in FIGS. 1 and 2 and the distribution of light on the solar panel resulting from 3-degree off-pointing, respectively.
Figure 3B:
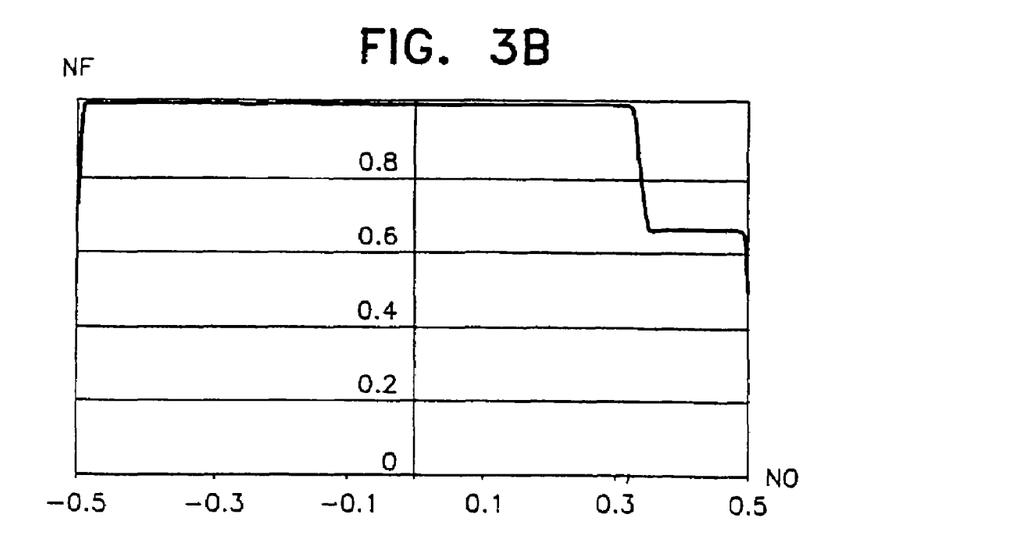

The spacecraft pointing accuracy directly influences the design of solar concentrators. They need to be compatible with the range of variation of the sun ray direction with respect to the solar panel. Body-stabilized spacecraft are not equipped with north-south tracking capability. The seasonal variation is plus or minus 23.5 degrees. For that reason, concentrators are not designed to perform concentration on that axis. Sun tracking is performed on the east-west axis with accuracy in the range of plus or minus 2 degrees. Concentrators need to withstand slightly larger tracking errors for reliability insurance. Referring to FIG. 3, consequence of pointing error is depicted. The simulation is true as well for saw-tooth concentrator (FIG. 1) than for trough concentrator (FIG. 2) The off-pointing axis corresponds to the east-west roll of the panel only. FIG. 3A shows the collection efficiency (CE) with respect to the angle of incidence ($\alpha$) of sun radiation. The first reason of efficiency loss is coming from the cosine law (CL). The projected area is decreasing with a cosine law when the angle of incidence is increasing. This is true for any surface inclined with respect to the sun and it is not related to concentration. It is the main reason of sun tracking on stabilized spacecraft. The second loss factor is directly related to concentration (Corrected Flux(CF)). It shows an efficiency drop-off to about 50 percents when the solar concentrator is about 30 degrees off-pointed with respect to the sun. Zero collection occurs with an about 60 degrees off-pointing, when the solar cell rows are fully shadowed by the reflectors. FIG. 3B shows a realistic case when the off-pointing is only 3 degrees, the normalized flux (NF) vs. the normalized ordinate (NO) along the off-pointing cells. The distribution of light in between two reflectors is depicted. In the case of the present invention, this area is occupied by a solar cell row. The normalized ordinate depicted in FIG. 3B corresponds with the width of each individual solar cell. In the case of the prior invention, referring to FIG. 2, this area is the solar panel width including several adjacent solar cells. Any distribution non-uniformity is reflected on the adjacent solar cells. Some cells will receive only 65 percents of the nominal flux. Power conversion will probably be affected by this distribution. The electric current generated by those cells will be 65 percents of the nominal current. Serial connected cells require a high uniformity of generated current to collect the power from the whole solar panel. The non-uniformity of light radiation at panel level will lead to a significant decrease of available power to the spacecraft. Referring to the present invention (FIG. 1), the non-uniformity exists too but at cell width level only. The loss of cell power generation will be at the same order. Each cell suffers from the same loss factor. The generated power is still uniform from cell to cell. The serial connection is still perfectly valid and no additional loss is expected.

Figure 4:
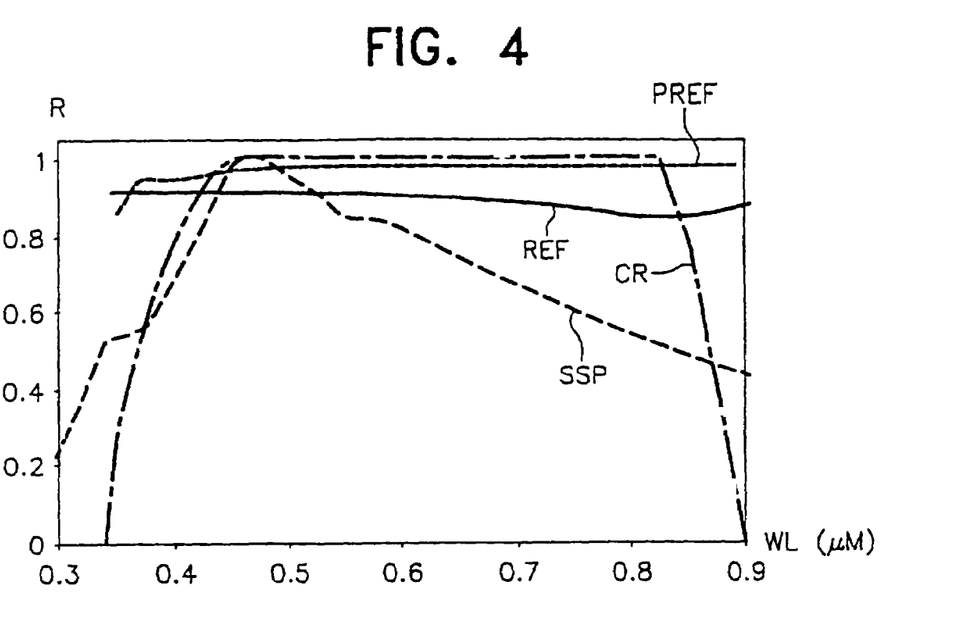
FIG. 4 shows reflectivity R of a reflector film with 60 degrees incidence with respect to reflector normal for unpolarized light as a function of wavelength WL. The typical response CR of a multi-junction GaAs/Ge solar cell and the solar radiation spectrum SSP are also depicted. The reflectivity REF of vacuum deposited aluminum and over protected ($SiO_2$ 160 nm thick) silver PREF is depicted for comparison.

The reflective metallic coating on the surface of reflector 13 facing away from the base panel 11 may be either Aluminum, Silver or any efficient solar reflective coating. Aluminum is commonly used due to its manufacturing easiness and its good resistance to space environment (mainly radiation). Silver is not radiation resistant. It needs to be over-coated with a transparent layer. $SiO_2$ and $Al_2O_3$ are good candidates. Due to the over-coating requirement, Silver is not as straightforward to handle as Aluminum. The reason of interest on Silver coated reflectors is due to its better reflectivity in the visible range. It is commonly admitted that VDA coating gets a reflectivity of about 90 percents and Silver coating reaches a reflectivity of about 95 percents under normal incidence in the visible spectral range. For one preferred embodiment of the present application, we are interested in reflectivity at about 60 degrees incidence instead of normal incidence. The spectral range of interest is not limited to the visible range: multi-junction GaAs solar cells are sensitive from about 350 nm to about 1800 nm. The solar flux is not flat over this spectral range: maximum intensity is reached at 450-500 nm. Flux drop-off occurs in the UV range. Slower decrease is observed in the red and IR range. Referring to FIG. 4, the reflectivity at 60 degrees of aluminum and protected silver coating is depicted. Silver protection is made of a 160 nm $SiO_2$ layer. For understanding and calculation purposes, the solar flux spectrum (SSP) and the photovoltaic cell response are depicted too (normalized under arbitrary units versus wavelength (WL)).

Several options for the self-deploying reflector are possible. The two preferred embodiments are described in the following paragraph. They are both constituted by elastic metallic foils allowing a coupling of both reflector functions: the reflective effect and the deployment. In U.S. Pat. No. 6,188,012, the compressible reflector apparatus comprises a reflective concentrator and a spring coupled to the said concentrator. Similarly, in U.S. Pat. No. 6,177,627, the collapsible reflector comprises a fully flexible sheet and an erector mounted to the base. It means that the two functions of reflecting the light and erecting the reflectors are assured by two distinctive parts. In the present invention, for both the preferred embodiments, these two functions of reflecting the light in deployed configuration and erection of the reflectors are assured by only one single element.

Figure 5:
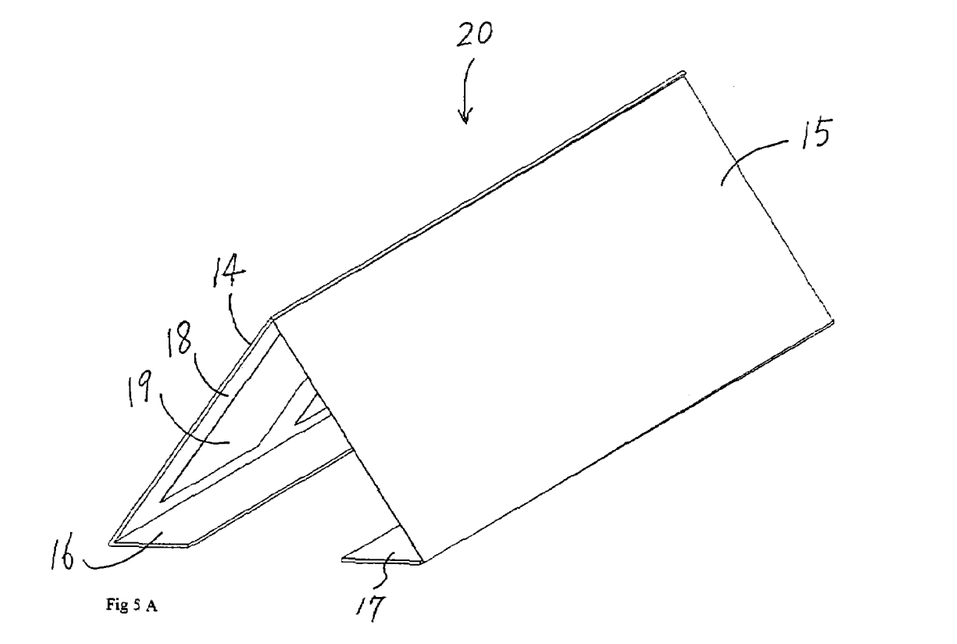
FIG. 5A is a perspective view of the first embodiment of the present invention in deployed configuration.
FIG. 5B is a perspective view of the first embodiment of the present invention in stowed configuration.
FIG. 5C is a top plan view of the first embodiment of the present invention made from a locally thinned foil or other material unfolded in a horizontal surface and FIG. 5D is an elevated sectional view taken along lines 5D-5D of FIG. 5C of the first embodiment of the present invention.
Figure 5B:
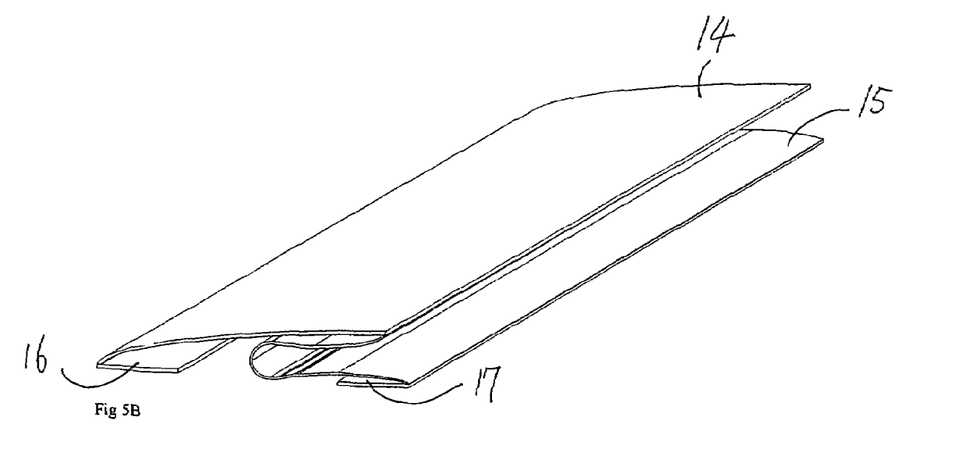
Figure 5C:
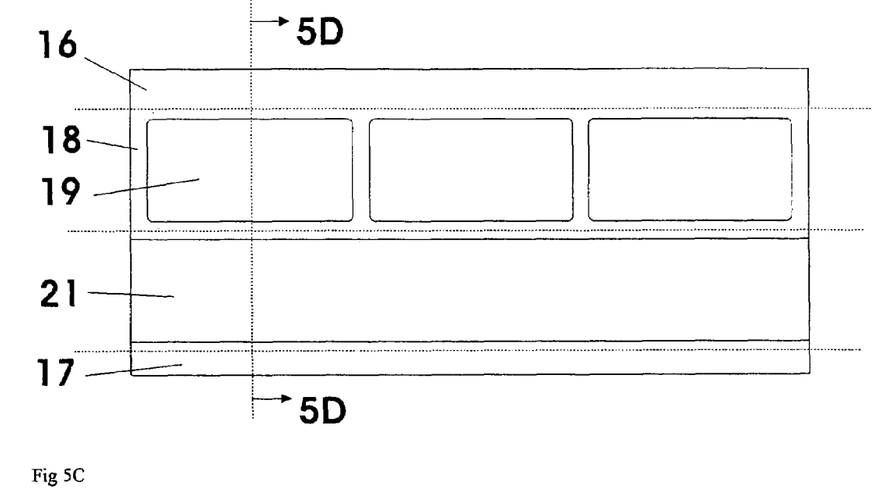
Figure 5D:
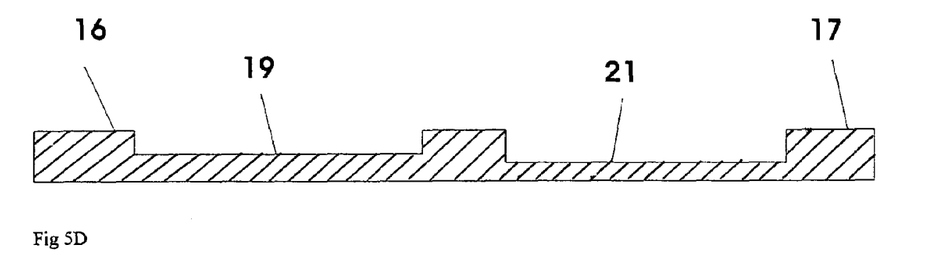

In a first embodiment of the present invention, the device 20 is made of thin sheet of metal or other materials, reflective on the surfaces of panel sides 14, 15 that face away from the base 11, to assure the reflection of the light when deployed (FIG. 5A). This sheet is thin enough to have a very low weight and a low stored energy in the stowed configuration (FIG. 5B). In the stowed configuration, a compressive force is exerted on the device 20 by a conventional locking mechanism to prevent the rebound and deployment of both sides 14, 15. Small ribs 18 are present on some specific locations of the non-reflective surface facing towards the base 11 to give a higher elasticity to the thin part 19 surrounded by ribs 18 and procure an integrated frame for structural stiffness purpose (see the unfolded reflector on FIG. 5C). These ribs 18 have a particular design to allow an adapted self-deployment of the reflector 20 when folded and supply adequate tension of the thin sheet when deployed to avoid ripples. This monolithic device 20 can be made in a single sheet of metal, like high strength Titanium alloy, or other materials and avoid the use of two different elements for the deployment and the optical function of the reflectors. Typical thickness is 50-100 microns in the ribs and frame area 18 and 20-30 microns in the thinned area 19. The proper thicknesses are nevertheless not limited by these numbers and can vary depending on the material used to make the sheet, the structure of the device 20 and other factors. The process to obtain thinned area 19 may be chemical etching, high-speed milling, advanced rolling, etc. In addition, to reach a minimum weight, the sheet is thinned where no spring effect is needed, such as the area 21 on the folding panel side 15 (FIG. 5C), but just supporting thin layer for reflection purpose. The stiffness and spring effect of the embodiments of the present invention can be adjusted to maintain a better reflector shape of the monolithic device by adequate sizing, geometry and position of the thicker integrated ribs and frame 18. This improvement is not possible with constant thickness sheet. In addition, the stored energy in stowed configuration is important for the panel deployment. This stored energy has to be adapted in a range of values compatible with a safe panel deployment. The stored energy can be easily adapted by modifying the geometry (thicknesses and widths of the integrated ribs).

Figure 6A:
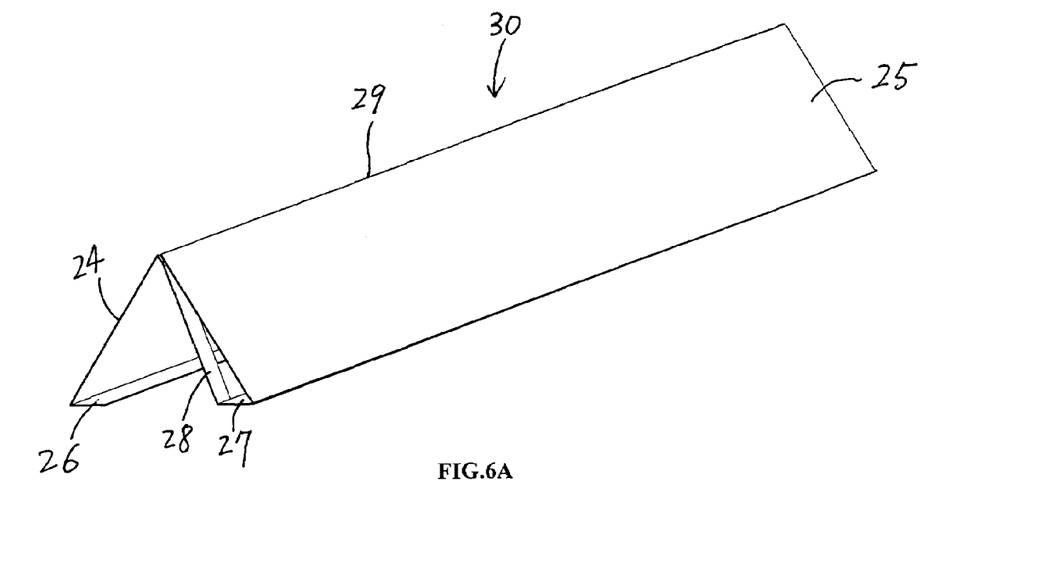
FIG. 6A is a perspective view of the second embodiment of the present invention in deployed configuration.
Figure 6B:
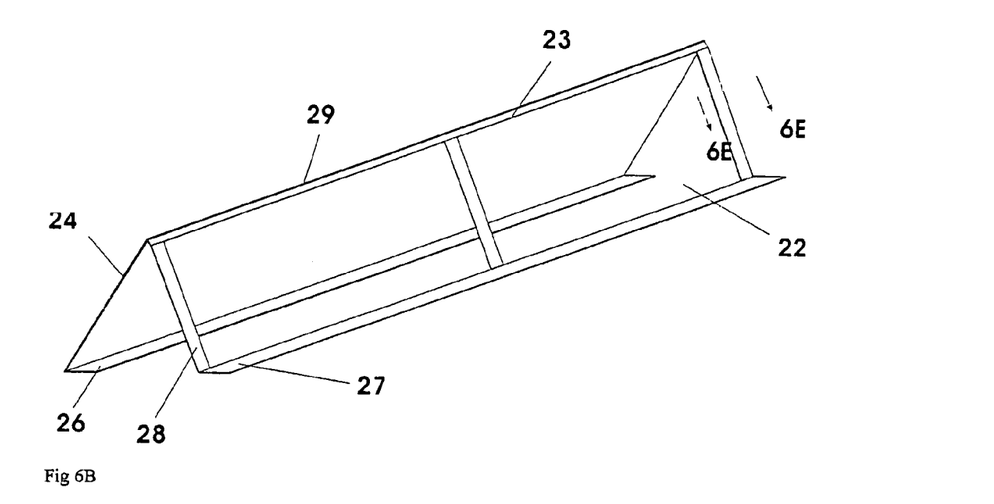
FIG. 6B is a perspective view of the second embodiment of the present invention with the second reflecting side removed and showing the stopped side with the stop strips and the access to the under reflector area, and the other reflector side is removed.
Figure 6C:
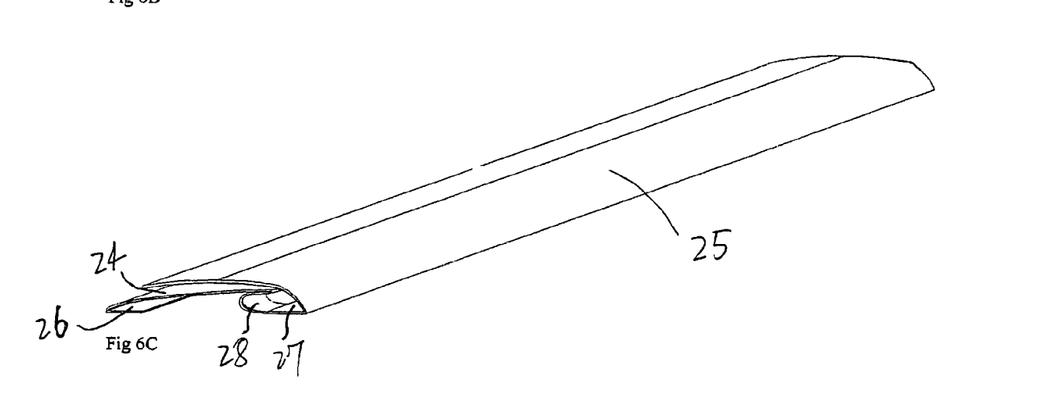
FIG. 6C is a perspective view of the second embodiment of the present invention in stowed configuration.
Figure 6D:
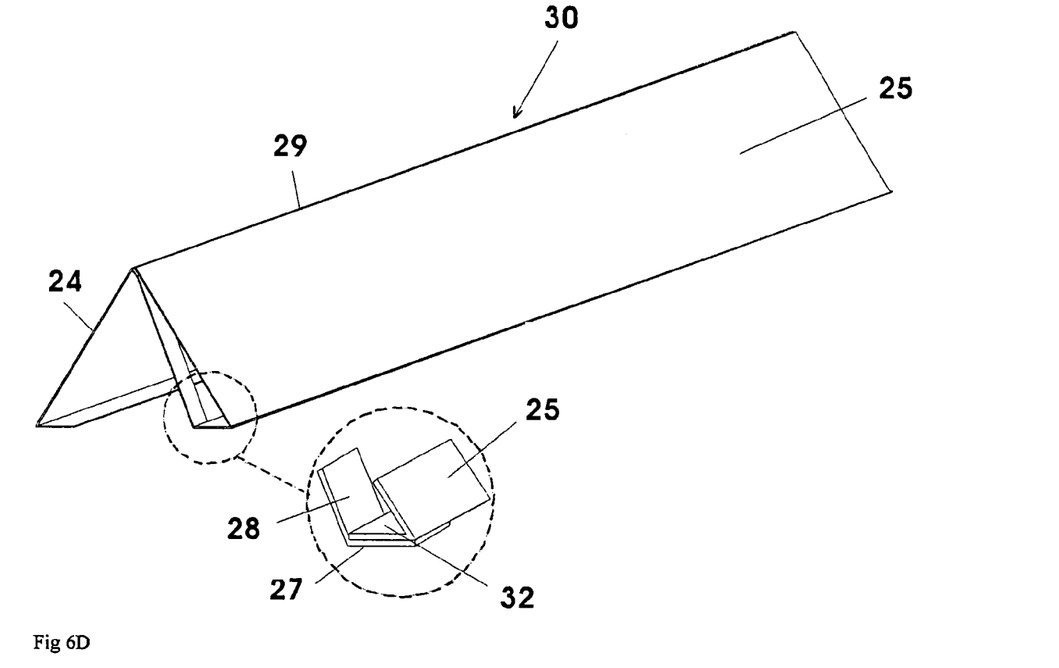
FIG. 6D is a perspective view of the second embodiment of the present invention make from two parts and an enlarged partial perspective view of two overlapped and elongated sections is also provided.
Figure 6E:
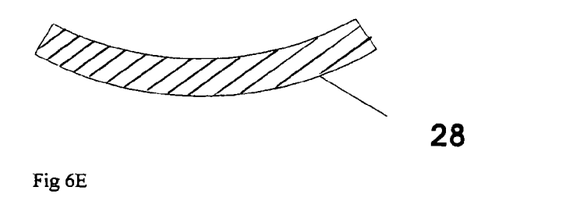
FIG. 6E is a sectional view taken along lines 6E-6E of FIG. 6B of the second embodiment of the present invention.

In a second preferred embodiment of the present invention (FIG. 6A: deployed configuration) a single piece of sheet made of metal or other materials is bent and hollowed in particular way. The reflector 30 includes a first and a second elongated sections 26, 27 being parallel to the rows of solar cells 12 (FIG. 1), fixed to the base 11 (FIG. 1) and spaced apart; a first side 24 being coated with reflective coating on one surface facing away from the base 11 and in connection with the first section 26; a second side 23 connecting the first side 24 and one side of the second section 27 that is proximal to the first section 26; and a third side 25 being coated with reflective coating on one surface facing away from the base 11 and in connection with the other side of the second section 27 that is distal to the first section 26. Therefore, unlike other devices, the two reflective sides 24,25 of each of the reflectors 30 in deployed configuration are split (not connected) at the apex of the reflector in deployed position to allow intervention under the reflectors without removing the sides 24,25 (FIG. 6B). This is convenient for implementing the harnessing and reparation by accessing to the space under the reflectors 30 which may contain certain electronic components. Therefore, both reflector sides 24, 25 are independent during the deployment. During deployment, the first side 24 will pivot away from the base 11 and form a cross-sectional triangular shape with the second side 23. Such triangular shape structure supports the third side 25 to pivot away from said base 11 so that an upper part, for example the top edge of the third side 25 is in contact with a dihedral edge 29 between the first side 24 and the second side 23. In the stowed configuration (FIG. 6C), upon exertion of compressive force by a conventional locking mechanism to lock both sides 24, 25 and prevent their rebound and deployment, both sides 24, 25 are stacked and none of them is over-stressed or over-bent (bent exceeding the elastic limit of the material) during the long stowage period prior to the launching. More specifically, the first side 24 and the third side 25 will pivot toward the base 11 with their surfaces unfolded. The third side 25 will cover the first side 24. The second side 23 will be folded so that the reflectors 30 will collapse. This stowed configuration is advantageous in order to minimize the stored energy during stowage period. Actually, the stored energy is at the origin of some deployment problems. The stored energy can be less than 0.1 J per square meter, for example, as low as 0.063 J per square meter for reflectors stowed inside a 10 mm gap between two folded solar panels both equipped with folded reflectors or equivalent reflectors stowed inside a 5 mm spacing. Due to the stowage configuration, the materials will not suffer as much of the relaxation (and then shape error) than other embodiments. It definitely ensures a more accurate shape of the deployed reflector. Due to inertia during the deployment, a blocking system including small strips 28 stops the stroke of the lower side 24 in the stowed stack. The upper side 25 will firstly be deployed and supported by the other side 24. Then the upper side 25 will stop on the other side 24 and be in contact with the dihedral edge 29 between the sides 23, 24. This device 30 makes it possible to avoid a crossing of both sides 24, 25, which would induce a bad final reflector shape. The stopping device could be constituted by small strips 28 separated by openings 22 in the original sheet. The small strips 28 could be formed with a small curvature along their length in order to prevent the strip relaxation during the pre-launch phase, like a carpenter type hinge, as shown in FIG. 6E. When the strips 28 will be deployed, they will recover their curvature and then they will be stiffer and straighter in the deployed configuration. Of course, the curvature has to be implemented in a way that it does not disturb the collapsing in the stowed configuration. The thin original sheet could be a highly flexible sheet like high strength Titanium alloy. The thickness would be in the range of about 25-30 microns. The thickness may vary depending on the material used, the structure and other factors. The reflector 30 could be made in one single element or it could be separated in two elements, one for side 23-24 and the other for side 25. In the later case, the strips 28 would be linked to a base section 27, which would be stacked with the base section 32 of the other side 25 as shown in FIG. 6D. Finally, this embodiment has the advantage to be easy to manufacture and in addition, the shaping uncertainties can be slightly corrected due to the kinematics. Actually, according to the shaping uncertainties (on the angles) the stopped side 24 will be under-bent (bent within the elastic limit of the material) and the other side 25 will be slightly over-bent (bent exceeding the elastic limit of the material). With this process, the stopped side 24 will apply a small tension in the strips 28 and the other side 25 will apply a small pressure on the stopped side 24. Of course, a small curvature will appear on both sides because of the forming uncertainties but its importance on the final shape will be depending on the shaping accuracies.

The foregoing is considered as illustrative only of the principles of the invention. Further, since numerous modifications and changes will readily occur to those skilled in the art, it is not desired to limit the invention to the exact construction and operation shown and described, and, accordingly, all suitable modifications and equivalents may be resorted to, falling within the scope of the invention.

What is claimed is:

1. A solar concentrator comprising rows of solar cells alternating with rows of collapsible reflectors to reflect incident energy onto directly adjacent solar cells and a base on which the rows of reflectors and rows of solar cells are mounted, wherein each row of the reflectors comprises:
   a first and a second elongated sections being parallel to the rows of solar cells, fixed to said base and spaced apart,
   a first panel being coated with reflective coating on one surface facing away from the base and being in connection with one side of the first section that is proximal to the row of solar cells,
   a second panel connecting the first panel and one side of the second section that is proximal to the first section, and
   a third panel being coated with reflective coating on one surface facing away from the base and being in connection with the other side of the second section that is distal to the first section,
   wherein, absent external forces, said first panel will pivot away from said base and, with the second panel, will form a cross-sectional triangular shape and support the third panel to pivot away from said base such that an upper part of the third panel distal to the base is in contact with a dihedral edge between the first panel and the second panel; and upon exertion of compressive force, said first panel and third panel will pivot toward said base with their surfaces unfolded, said third panel covers the surface of said first panel that faces away from the base, and the second panel is capable of being folded towards the base so that said reflector will collapse.

2. The solar concentrator according to claim 1, wherein the first section, the first panel, the second panel, the second section and the third panel of each of the reflectors are sequentially connected and made of one piece of sheet.

3. The solar concentrator according to claim 2, wherein said piece of sheet has a thickness of about 25-30 micros.

4. The solar concentrator according to claim 1, wherein the third panel tends to pivot toward the base absent external force so that when the reflector is deployed, the first panel pivots away from the base, the third panel applies pressure on the dihedral edge between the first panel and the second panel.

5. The solar concentrator according to claim 1, wherein each of said reflectors is made of two pieces of sheets, one piece of sheet including the first elongated section, the first panel, the second panel and a third elongated section sequentially connected; and the other piece of the sheet including the second elongated section and the third panel sequentially and integrally connected; wherein the third section is stacked with the second section and both sections are fixed to the base.

6. The solar concentrator according to claim 1, wherein the first panel is bent with a compressive force below the elastic limit of the material.

7. The solar concentrator according to claim 1, wherein the second panel of each of the reflector includes a plurality of elongated stripes separated by openings.

8. The solar concentrator according to claim 7, wherein the openings provide access to the space under said reflector for reparation purpose.

9. The solar concentrator according to claim 7, wherein at least one strip has a cross-sectionally curved surface.

10. The solar concentrator according to claim 7, wherein said plurality of strips of the second panel are parallel to each other and in the direction vertical to the dihedral edge between the first panel and the second panel when the reflector is not collapsed.

11. The solar concentrator according to claim 7, wherein the first section, the first panel, the second panel, the second section and the third panel of each of the reflectors are sequentially connected and made of one piece of sheet.

12. The solar concentrator according to claim 7, wherein the third panel tends to pivot toward the base absent external force so that when the reflector is deployed, the first panel pivots away from the base, the third panel applies pressure on the dihedral edge between the first panel and the second panel.

13. The solar concentrator according to claim 7, wherein each of said reflectors is made of two pieces of sheets, one piece of sheet including the first elongated section, the first panel, the second panel and a third elongated section sequentially and integrally connected; and the other piece of the sheet including the second elongated section and the third panel sequentially and integrally connected, wherein the third section is stacked with the second section and both are fixed to the base.

14. The solar concentrator according to claim 1, wherein the reflector has a stored energy of lower than 0.1 J/m$^2$.

15. The solar concentrator according to claim 1, wherein the reflectors are made of a high strength Titanium alloy.

16. A solar concentrator comprising rows of solar cells alternating with rows of collapsible reflectors to reflect incident energy onto directly adjacent solar cells and a base on which the rows of reflectors and rows of solar cells are mounted, wherein each row of the reflectors comprises:

a sheet having a pair of opposite surfaces with reflective coating on one surface facing away from the base, said sheet comprising:
   a pair of parallel edges being fixed to said base and spaced apart, and
   a first and a second sides, each being in connection with one of said pair of edges;

wherein, absent external forces, said first side will pivot away from said base and, with the second sides, will form a cross-sectional triangular shape, and upon exertion of compressive force, said first side will pivot toward said base, the second side is capable of being folded towards the base and said sheet will collapse;

wherein the first side includes integrated ribs of a first thickness surrounding thinner parts of a second thickness.

17. The solar concentrator according to claim 16, wherein said second side includes areas of a third thickness, said second and third thickness being thinner than the first thickness.

18. The solar concentrator according to claim 17, wherein the first thickness is about 50-100 um, and the second and the third thicknesses are about 15-25 um, respectively.

19. The solar concentrator according to claim 18, wherein the reflectors are made of a high strength Titanium alloy.

* * * * *